United States Patent [19]

Sato et al.

[11] Patent Number: 4,743,564

[45] Date of Patent: May 10, 1988

[54] METHOD FOR MANUFACTURING A COMPLEMENTARY MOS TYPE SEMICONDUCTOR DEVICE

[75] Inventors: Masaki Sato, Kawasaki; Kazuyoshi Shinada, Yokohama, both of Japan

[73] Assignee: Kabushiki Kaisha Toshiba, Kanagawa, Japan

[21] Appl. No.: 813,142

[22] Filed: Dec. 24, 1985

[30] Foreign Application Priority Data

Dec. 28, 1984 [JP] Japan .............................. 59-276138
Jul. 25, 1985 [JP] Japan .............................. 60-164612

[51] Int. Cl.$^4$ .................. H01L 21/425; H01L 21/441
[52] U.S. Cl. ........................................ 437/24; 437/34; 437/192; 437/203; 437/982
[58] Field of Search ..................... 437/24, 34, 56, 57, 437/192, 200, 203, 236, 240, 982

[56] References Cited

U.S. PATENT DOCUMENTS

| | | | |
|---|---|---|---|
| 3,986,903 | 10/1976 | Watrous, Jr. ...................... | 148/187 |
| 4,348,802 | 9/1982 | Shirato .................................. | 29/571 |
| 4,349,584 | 9/1982 | Flatley et al. ....................... | 427/85 |
| 4,363,830 | 12/1982 | Hsu et al. ............................ | 427/88 |
| 4,378,628 | 4/1983 | Levinstein et al. ................. | 29/571 |
| 4,404,733 | 9/1983 | Sasaki .................................. | 29/571 |
| 4,442,591 | 4/1984 | Haken .................................. | 29/571 |
| 4,528,744 | 7/1985 | Shibata ................................. | 29/571 |
| 4,551,908 | 11/1985 | Nagasawa et al. ................ | 29/571 |

FOREIGN PATENT DOCUMENTS

| | | | |
|---|---|---|---|
| 0119746 | 7/1984 | Japan ........................ | 148/DIG. 133 |
| 0201426 | 11/1984 | Japan ........................... | 148/DIG. 4 |
| 0132345 | 7/1985 | Japan ........................ | 148/DIG. 133 |
| 0880174 | 7/1984 | U.S.S.R. ....................... | 148/DIG. 4 |

*Primary Examiner*—Olik Chaudhuri
*Attorney, Agent, or Firm*—Finnegan, Henderson, Farabow, Garrett and Dunner

[57] ABSTRACT

A method for manufacturing a CMOS type semiconductor device is shown which includes the following steps. A first and a second conductive diffusion region are formed in a well region and a semiconductor substrate, respectively, and a gate electrode is formed thereon. An insulation layer is formed on the semiconductor substrate and the well region. A contact hole is opened by selectively removing the insulation layer corresponding to the first and the second conductive diffusion regions. At least one metal layer selected from a group consisting of metal and metal silicide having a high melting point is formed on an exposed surface of the first and the second conductive diffusion regions. The semiconductor substrate is heated to melt at least part of the insulation layer and form a tapered portion. A wiring layer is formed on the contact hole. This method prevents the contact resistance from increasing, the impurity of one region from diffusing into the other impurity regions, the impurity of the impurity regions from decreasing, and improves the reliability of the wiring layer by forming a tapered contact hole. These advantages permit high component density by miniaturizing the device.

12 Claims, 6 Drawing Sheets

METHOD FOR MANUFACTURING A COMPLEMENTARY MOS TYPE SEMICONDUCTOR DEVICE

BACKGROUND OF THE INVENTION

The present invention relates to a method for manufacturing a MOS (CMOS) type semiconductor device, and more particularly to a method for manufacturing a CMOS type semiconductor device which includes an improved method for forming a contact hole and a wiring layer.

In the manufacture of semiconductor devices, it is necessary to decrease the contact hole size for the wiring layer so that the semiconductor devices may be miniaturized in order to accomplish high speed operations and high packing densities.

When the contact hole size decreases, the depth of an element in the device does not always decrease in the same proportion. In general, it is necessary to form a deep contact hole because the ratio between the thickness of the insulation layer in the contact hole region and the contact hole size becomes large as the semiconductor device is miniaturized. After the deep contact hole is formed, the wiring layer is formed by depositing metal on the deep contact hole. Often the wiring layer formed in the contact hole region is thinner than in the surrounding regions and the reliability of the wiring layer is decreased.

In Japanese Patent Publication No. 58-4817, the connection between the wiring layer and a semiconductor substrate in the contact hole is improved by forming a wide opening portion at the upper part of the contact hole. Specifically, as shown in FIG. 1, a phospho-silicate glass (PSG) layer 3 used as a low temperature melt insulation layer is provided on an insulation layer 2 formed on a semiconductor substrate 1, a contact hole 4 is opened, the PSG 3 is melted by heating the substrate 1 to a high temperature and a wider opening portion at the upper part of the contact hole is formed. An N type diffusion region 5 is formed in the substrate 1 as shown in FIG. 1. In general, a boron doped phospho-silicate glass (BPSG) may be used as a passivation layer in place of the PSG layer.

However, when this method is applied to CMOS type semiconductor devices, the surface impurity concentration of the N or P type diffusion regions in the semiconductor substrate decreases and the contact resistance between the wiring layer and the diffusion regions increases for the following reasons:

(1) The phosphorus included in the PSG as an impurity diffuses into the P-type diffusion region during the high temperature step;

(2) N-type impurity in the N-type diffusion region diffuses into the P-type diffusion region or P-type impurity in the P-type diffusion region diffuses into the N-type diffusion region; and (3) The boron included in the BPSG as an impurity diffuses into the N-type diffusion region during the high temperature step.

SUMMARY OF THE INVENTION

An object of this invention is to provide a method for manufacturing a CMOS type semiconductor device which prevents the contact resistance from increasing and improves the reliability of the wiring layer by forming a tapered portion in the contact hole.

A further object of this invention is to provide a method for manufacturing a CMOS type semiconductor device which prevents the passivation layer impurity from diffusing into the impurity region of the semiconductor device.

Another object of this invention is to provide a method for manufacturing a CMOS type semiconductor device which permits high component density by miniaturizing the device.

In order to achieve the above objects, a method for manufacturing a CMOS type semiconductor device is disclosed which comprises the steps of:

forming a first conductive diffusion region in a well region, forming a second conductive diffusion region in a semiconductor substrate and forming a gate electrode thereon;

forming an insulation layer on the semiconductor substrate and the well region;

opening a contact hole by selectively removing a portion of the insulation layer corresponding to the first conductive diffusion region and the second conductive diffusion region;

forming at least one metal layer consisting of metal and metal silicide having a high melting point on an exposed surface of the first conductive diffusion region and the second conductive diffusion region;

heating the semiconductor substrate so as to melt at least part of the insulation layer and form a tapered portion of the contact hole; and forming a wiring layer on the contact hole.

In order to achieve the above objects, an alternate method for manufacturing a CMOS type semiconductor device is disclosed which comprises the steps of:

forming a first conductive diffusion region in a well region, forming a second conductive diffusion region in a semiconductor substrate and forming a gate electrode thereon;

forming at least one metal layer consisting of metal and metal silicide having a high melting point on an exposed surface of the first conductive diffusion region and the second conductive diffusion region;

forming an insulation layer on the semiconductor substrate and the well region;

opening a contact hole by selectively removing a portion of the insulation layer corresponding to the first conductive diffusion region and the second diffusion region;

heating the semiconductor substrate so as to melt at least part of the insulation layer and form a tapered portion of the contact hole; and forming a wiring layer on the contact hole.

BRIEF DESCRIPTION OF THE DRAWINGS

Other objects and advantages of the invention will become apparent from the following detailed description when taken in conjunction with accompanying drawings, in which.

DESCRIPTION OF THE PREFERRED EMBODIMENTS

The present invention will now be described in detail according to the various embodiments.

The first embodiment of a CMOS semiconductor device according to the present invention is shown in FIGS. 2A through 2E. FIGS. 2A–2E are cross-sectional views showing the manufacturing steps.

Figure 1:
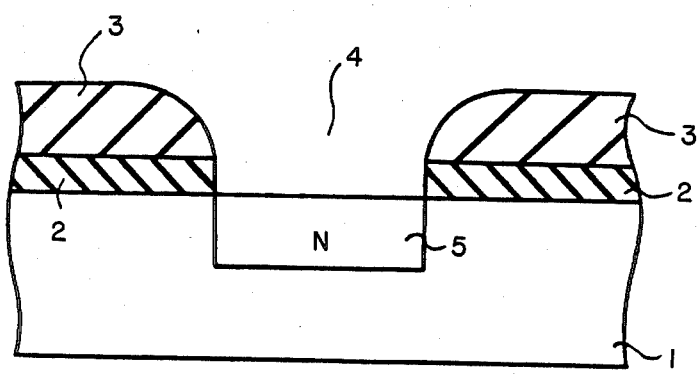
FIG. 1 is a cross-sectional view of a conventional semiconductor device.
Figure 2A:
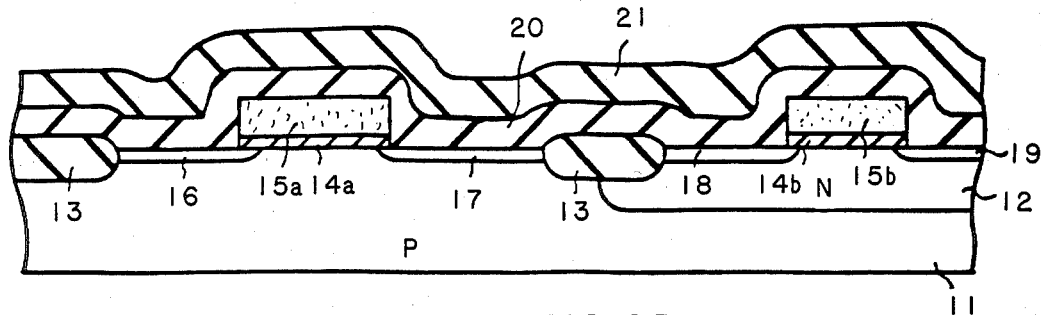
FIGS. 2A-2E are cross-sectional views showing the manufacturing steps used to produce a first embodiment of the CMOS semiconductor device in accordance with the invention.

Referring first to FIG. 2A, field insulation regions 13 are formed in the surface of a p-type silicon substrate 11 into which an N-well region 12 has been formed. A gate electrode 15a consisting of a polysilicon doped n-type impurity, for example phosphorous or arsenic, is formed on an N-channel region in the surface of substrate 11 over a gate insulation layer 14a. A gate electrode 15b, consisting of the same polysilicon doped n-type impurity as gate electrode 15a, is formed on a P-channel region located in the surface of the N-well region 12 over a gate insulation layer 14b. In first conductive diffusion region, N+-type source and drain regions 16 and 17, are formed on the surface of the substrate 11. In second conductive diffusion region, P+-type source and drain regions 18 and 19, are formed on the surface of N-well region 12. The above-described manufacturing steps are well-known in the prior art.

A $SiO_2$ layer 20, used as an insulation layer, is formed 3000Å thick on the surface of substrate 11. PSG layer 21 of 8000Å thickness, which functions as a low temperature melting insulation layer, is formed on $SiO_2$ layer 20 as shown in FIG. 2A. A boron impurity is doped into the PSG layer 21 in order to increase its melting characteristics at low temperatures.

Figure 2B:
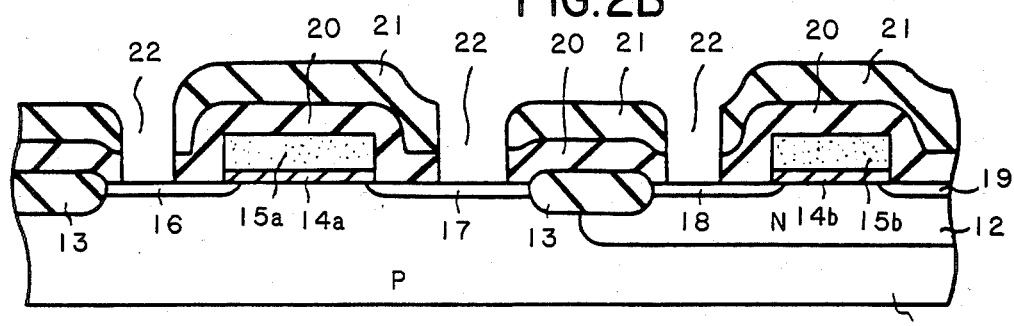

Portions of $SiO_2$ layer 20 and PSG layer 21 overlying the source regions 16 and 18, drain regions 17 and 19 and the gate electrodes 15a and 15b are selectively removed by the photolithography method, resulting in contact holes 22, as shown in FIG. 2B. The contact holes corresponding to drain region 19 and gate electrodes 15a and 15 b are not shown in FIG. 2B for purposes of clarity. However, in manufacturing a CMOS device, these contact holes are also formed. The nearly perpendicular shape of the opening shown in FIG. 2B is achieved by using an anisotropic dry etching technique in an atmosphere of $CH_4$ and $H_2$. It is desired that the openings be nearly perpendicular in order to increase the packing density of the device.

Figure 2C:
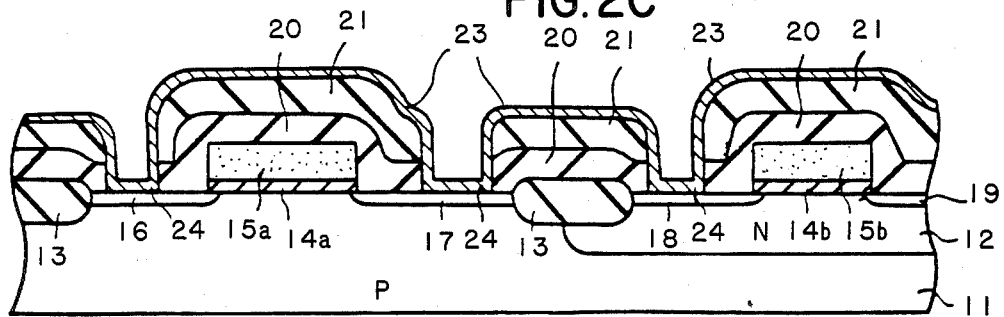

A titanium (Ti) layer 23 of 500Å thickness is next deposited as shown in FIG. 2C. Then an n-type impurity such as arsenic or phosphorus is ion-implanted into the interface between the N+-type source and drain regions 16 and 17 and Ti layer 23 provided thereon under the conditions of 50 KeV and $5\times10^{15}$ cm$^{-2}$ dose for $^{31}$p+, for example. A p-type impurity such as boron is ion-implanted under the conditions of 40 KeV and $5\times10^{15}$ cm$^{-2}$ dose into the interface between the p+-type source and drain regions 18 and 19 and the Ti layer 23 provided thereon. It is not always necessary to perform this ion-implantation step, but deep N+ type and P+ type regions can be formed in the contact hole and the reliability of the contact characteristic increased if the step is performed. Ti layer 23 on source regions 16 and 18 and drain regions 17 and 19 is made to react with substrate 11 by annealing substrate 11 under the conditions of 600° C. for 30 minutes in an $N_2$ atmosphere, for example, and a titanium silicide layer 24 of about 1000Å thickness is formed in the bottoms of contact holes 22. In this step, the Ti layer 23 provided on $SiO_2$ layer 20 and the glass layer 21 do not react because Ti layer 23 does not contact substrate 11, as shown in FIG. 2C.

Figure 2D:
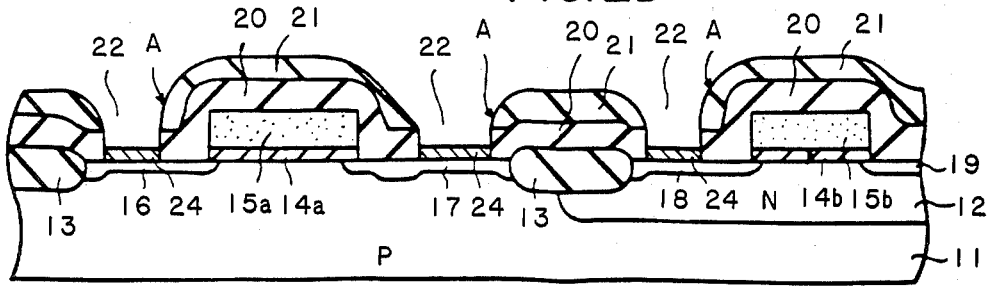

As shown in FIG. 2D, the portion of Ti layer 23 which does not react with the substrate is removed by a mixed solution of hydrogen peroxide, ammonium and water. Si is then ion-implanted into the whole substrate under the condition of about $1\times10^{15}$ cm$^{-2}$. It is desirable to ion-implant Si to promote the uniform production of the titanium silicide layer 24. The entire substrate is then heated to about 900° C. This heating step decreases the resistivity of titanium silicide layer 24 and causes the edges of the contact holes to become tapered due to melting of the glass layer 21.

Figure 2E:
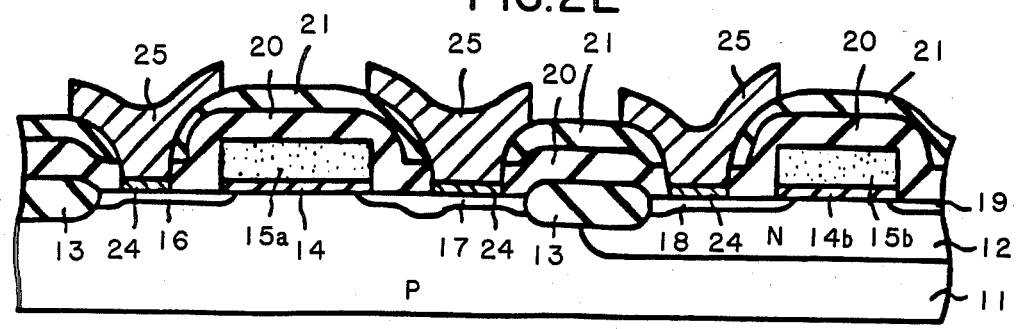

As shown in FIG. 2E, aluminum alloy is deposited over the substrate, patterned wiring layers 25 of about 1 ($\mu$m) thickness are formed in contact holes 12, and the CMOS semiconductor device is thus formed.

This embodiment has the following advantages:

(1) The titanium silicide layer 24 which is formed on the surface of source regions 16 and 18 and drain regions 17 and 19 prevents the impurity in source and drain regions 16–19 from mixing through contact holes 22.

Furthermore, the leakage of the impurities of the source and drain regions 16–19 through contact holes 22 is decresed. Therefore, a decrease in the surface impurity concentration of regions 16–19 is avoided and increase in the contact resistance is prevented.

(2) After contact holes 22 are formed, the surface of the device can be smoothed. In particular, as shown in FIG. 2D, since the tapered portions are formed at the vicinity of the contact hole through the heating process of about 900° C., when wiring layer 25 is formed on contact hole 22 it may be formed of uniform thickness and the reliability of wiring layer 25 is thus increased.

(3) Because the heating process is short and the titanium silicide layer 24 exists in the contact hole, source and drain regions 16–19 may be formed more shallow. Thus, it is possible to reduce the size of device.

Figure 3A:
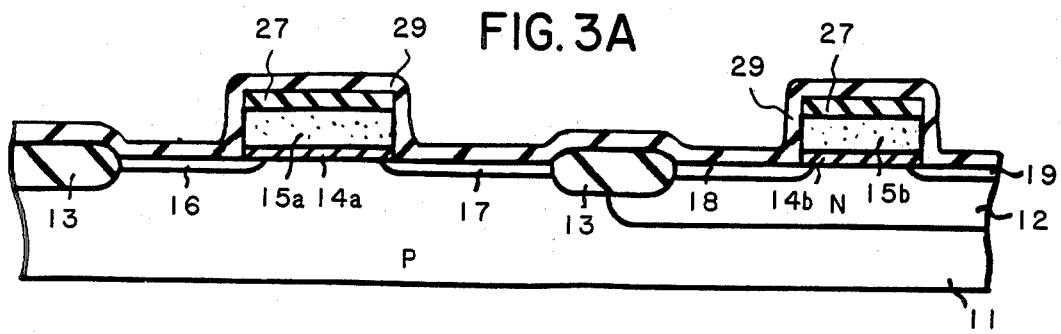
FIGS. 3A-3C are cross-sectional views showing the manufacturing steps used to produce a second embodiment of the CMOS semiconductor device in accordance with the invention.
Figure 3B:
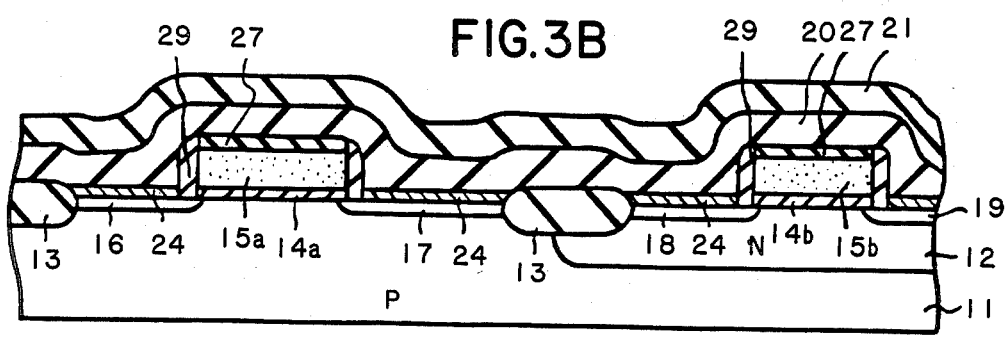

The second embodiment, shown in FIGS. 3A and 3B, will now be explained. Elements corresponding to elements in the first embodiment are referred to with the same reference number.

Source and drain regions 16–19, gate insulation layers 14a and 14b, and gate electrodes 15a and 15b are formed according to the method of the first embodiment as shown in FIG. 2A. A $SiO_2$ layer 27 of 2000Å thickness is formed on polysilicon layers 15a and 15b by a chemical vapor deposition (CVD) process and patterned by the usual photolithography technique as shown in FIG. 3A.

Next, a $SiO_2$ layer 29 of 2000Å thickness is deposited by the CVD method. Portions of the $SiO_2$ layer 29 are removed by a reactive ion etching process using a mixture of $CH_4$ and $H_2$ gases as the etchant, leaving a residual $SiO_2$ pattern on the gate electrode as shown in FIG. 3B. After the surface is cleaned, a titanium layer is deposited and annealed in an $N_2$ atmosphere. As in the first embodiment, the non-reacting titanium is removed and titanium silicide layer 24 is selectively formed on the surface of source and drain regions 16–19. Then SiO$_2$ layer 20 and PSG layer 21 are formed as shown in FIG. 3B.

Figure 3C:
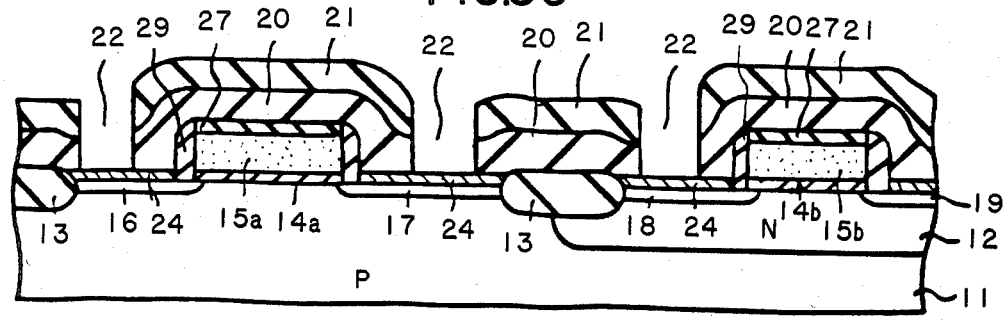

The portions of glass layer 21 and SiO$_2$ layer 20 which cover the diffusion contact and the gate contact are selectively etched and contact holes 22 are opened as shown in FIG. 3C. The CMOS semiconductor device is then formed following the same steps as described in the first embodiment.

The advantages provided by the first embodiment are also present in the second embodiment.

According to the two embodiments described above, titanium is used as the high-temperature metal contact. However, tungsten, molybdenum, tantalum or other metals with a high melting point may be used.

According to the embodiments described in detail above, the resistance of the contact hole is prevented from increasing. The wiring layer is formed on the $1.0 \times 1.0$ ($\mu m^2$) – $1.2 \times 1.2$ ($\mu m^2$) contact hole. A typical $1.0 \times 1.0$ ($\mu m^2$) P+ contact in the prior art is non-ohmic. However, in this invention the contact resistance of a typical $1.0 \times 1.0$ ($\mu m^2$) contact is less than 50.

Furthermore, this method of fabricating a CMOS semiconductor device prevents the mixing of impurity from one diffusion region to another, improves the reliability of the wiring layer, and reduces the size of the device.

The third embodiment, shown in FIGS. 4A–4H, will now be explained. FIGS. 4A–4H are cross sectional views showing the manufacturing steps.

Figure 4A:
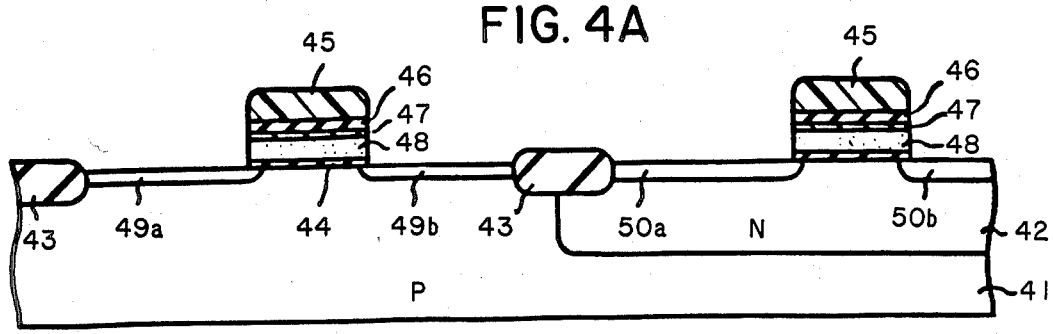
FIGS. 4A–4H are cross-sectional views showing the manufacturing steps used to produce a third embodiment of the CMOS semiconductor device in accordance with the invention.

Field insulation regions 43 are formed in the surface of a p-type silicon substrate 41 having a N-well region 42 in its surface, as shown in FIG. 4A. Gate insulation layers 44 of 300Å thickness are formed by oxidizing substrate 41 at 900° C. in an atmosphere of O$_2$+HCl(10%). Boron is then ion-implanted into the Si surface in the regions provided for the N channel and P channel transistor for adjusting the channel threshold voltage (Vth). A polysilicon layer is formed on the surface of substrate 41 by the CVD process, and phosphrous or arsenic impurities are then doped by using an ion-implanted method or a diffusion process of POCl$_3$. A thermal oxide layer of 150Å thickness and a silicon nitride layer of 1000Å thickness are then formed on the polysilicon layer. Desired resist patterns for the gate electrode 45 are formed by using photolithography techniques. A nitride layer pattern 46, thermal oxidation layer pattern 47 and polysilicon gate electrodes 48 are formed through the resist mask by an anisotropic dry etching process. The P-channel region is then covered by a resist mask and phosphorus is ion-implanted into the surface of the N-channel region in substrate 41 under the conditions of 60 keV and $1 \times 10^{13}$ cm$^{-2}$ dose, and N-type regions 49a and 49b are formed. The N-channel region is then covered by a resist mask and boron is ion-implanted into the surface of the P-channel region under the conditions of 40 keV and $1 \times 10^{15}$ cm$-2$ dose and p-type regions 50a and 50b are formed as shown in FIG. 4A.

Figure 4B:
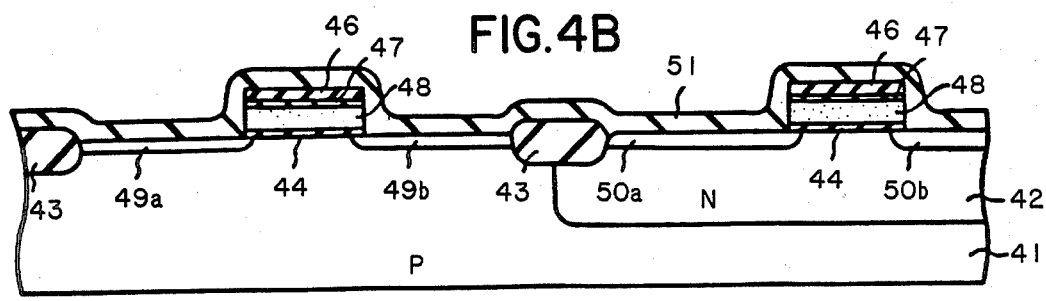

Next, the resist mask is removed and the surface of semiconductor substrate 41 is cleaned. A silicon oxide layer of 300Å thickness is formed on substrate 41 by oxidizing it under the condition of 900° C. in an O$_2$ atmosphere. Then a SiO$_2$ layer 51 of 3000Å thickness is formed on the entire surface of substrate 41 by using a low pressure chemical vapor deposition (LPCVD) process, as shown in FIG. 4B.

Next, SiO$_2$ layer 51 is removed except for a portion along the sidewall of gate electrode 48 by using an anisotropic dry etching process, under the conditions of 10 m Torr using a gas mixture of CF$_4$ and H$_2$ as an etchant. The surface of substrate 41 is cleaned and the P-channel transistor region is covered by a resist mask. Arsenic is then ion-implanted into the whole surface of substrate 41 under the cOnditions of 50 keV and $2 \times 10^{15}$ cm$^{-2}$ dose to form N+ regions 52a and 52b. Using the same process, boron is ion-implanted under the conditions of 40 keV and $1 \times 10^{15}$ cm$^{-2}$ dose so as to form P+ regions 53a and 53b as shown in FIG. 4C.

Figure 4C:
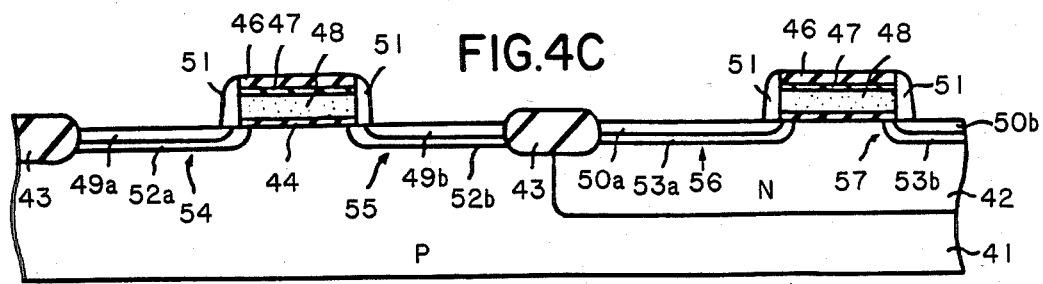

In FIG. 4C, N-type region 49a and N+-type region 52a are generically called source region 54 and N-type region 49b and N+-type region 52b are generically called drain region 55 of the N channel transistor. P-type region 50a and P+-type region 53a are generically called source region 56 of the P-channel transistor and P-type region 50b and P+-type region 53b are called drain region 57 of the P-channel transistor.

Figure 4D:
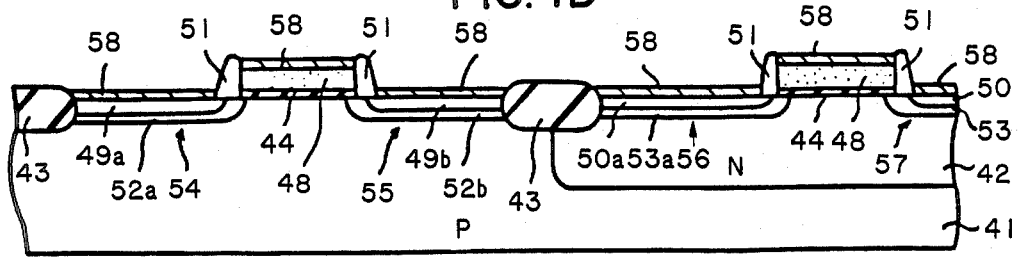
Figure 4E:
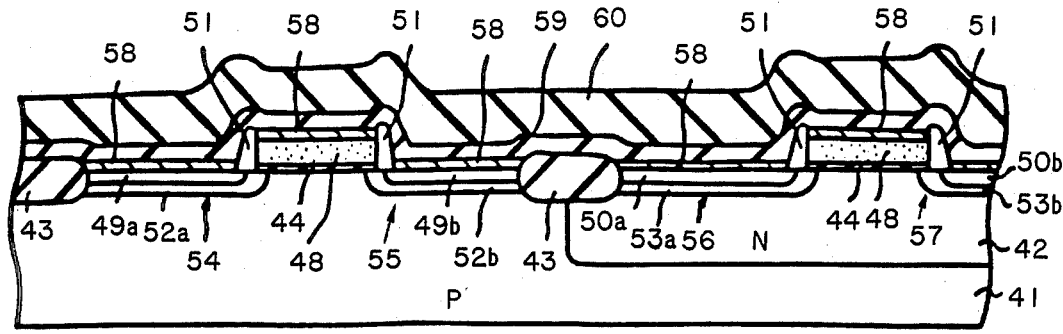

Next, the nitride layer pattern 46 is removed by using a plasma etching process with a mixture of CF$_4$ and O$_2$ as a etchant and the SiO$_2$ layer 47 is removed by using a buffered HF solution. As a result, the surface of gate electrode 48 and the surface of source and drain regions 54–57 are exposed. As shown in FIG. 4D, Tungsten (W) layers 58 of 200Å–500Å thickness are formed on the exposed surface of gate electrode 48 and source and drain regions 54–57 are formed by the LPCVD process using WF$_6$ as the main reaction gas and argon as a carrier gas. Tungsten layers do not form along the sidewalls of gate electrodes 48 because the SiO$_2$ layer 51 is present there. Tungsten silicide layers (not shown) of several angstrom thickness are then formed on the surface of Si substrate 41. A SiO$_2$ layer 59 of 2000Å thickness is formed on the whole surface of the substrate according to the CVD process, and a PSG layer 60 is then formed over SiO$_2$ layer 59 as shown in FIG. 4E. PSG layer 60 can be replaced by a BPSG layer, if desired.

Figure 4F:
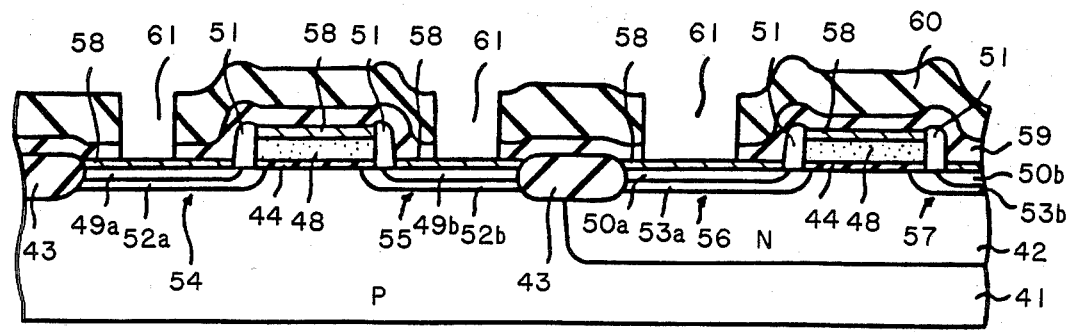

The portions of PSG layer 60 and SiO$_2$ layer 59 which cover source and drain regions 54–57 are selectively removed by an anisotropic dry etching technique, to open the contact holes 61 of $1.2 \times 1.2$ ($\mu m^2$) as shown in FIG. 4F.

Figure 4G:
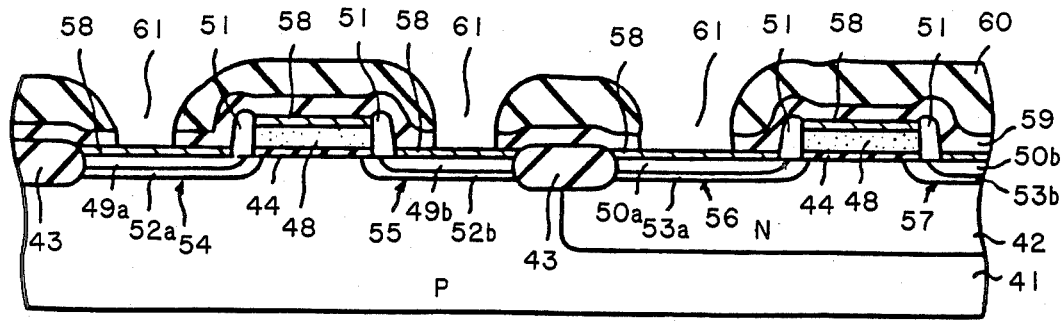

PSG layer 60 is then melted by radiant energy from a light source for a short time, to form a tapered portion in PSG layer 60 around contact hole 61 and to smooth the upper layer of the insulation layer on the surface of the substrate. The substrate is heated to 450° C. in advance, exposed to an atmosphere of N$_2$ gas and then exposed for 20 seconds to light from a halogen lamp. The temperature of the PSG surface layer increases to about 1000° C., and the upper layer of the insulation layer is smoothed as shown in FIG. 4G.

Figure 4H:
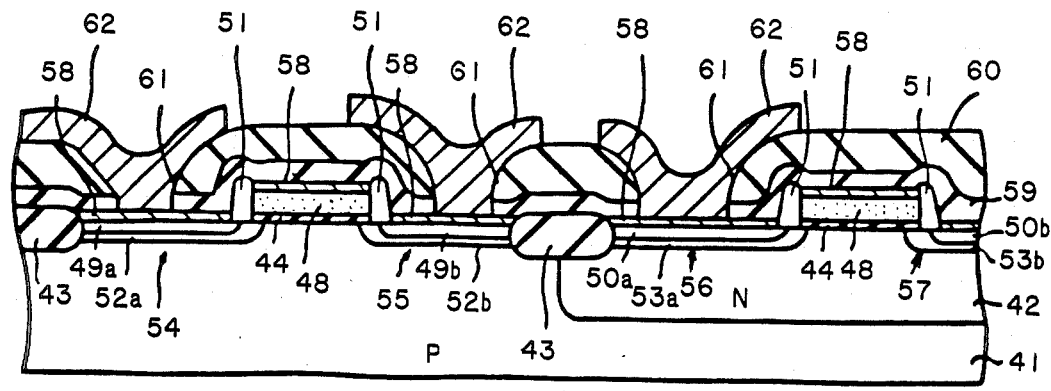

After an aluminum alloy is deposited on the device by evaporation, wiring layers 62 are formed on contact holes 61 by patterning the Al alloy. As a result, the CMOS semiconductor device is formed as shown in FIG. 4H.

This embodiment has the following advantages:

(1) Because a compound layer of tungsten silicide (not shown) and Tungsten layer 58 is formed on the surfaces of source regions 54 and 56 and drain regions 55 and 57 exposed at contact hole 61, and because the radiated light is reflected by the compound layer, substrate 41 is not exposed to the radiated light when the PSG layer 60 is melted by the radiated light. Therefore, the temperature of the inner part of substrate 41 is not increased. In addition, the compound layer reduces the migration of the impurities found in source and drain regions 54–57 through contact hole 61 toward the outside of substrate 41. Furthermore because the compound layers are present, the temperature of the substrate is held under 800° C. and the diffusing rate of phosphorus into source and drain regions 54–57 in substrate 41 from PSG layer 60 is decreased. Therefore the surface impurity concentration of these regions 54–57 is not decreased and the contact resistance is not increased.

(2) Because the radiated light is reflected by the compound layer (especially Tungsten layer 58) exposed at contact hole 61, onto the PSG layer 60 in the area surrounding contact hole 61, a tapered portion, having a gentle slope, is formed in the PSG layer 60 around the contact hole 61. Therefore, when wiring layer 62 is formed on contact hole 61 in the subsequent step, a wiring layer of uniform thickness can be formed without partially forming the thinner part, as in the prior art. In addition, because the upper portion of the insulation layer 60 on the substrate is heated to 1000°–1200° C. for several seconds, it is smoothed.

(3) Because of the compound layer, source and drain regions 54–57 can be formed shallower, and it is possible to reduce the size of the device.

Figure 5A:
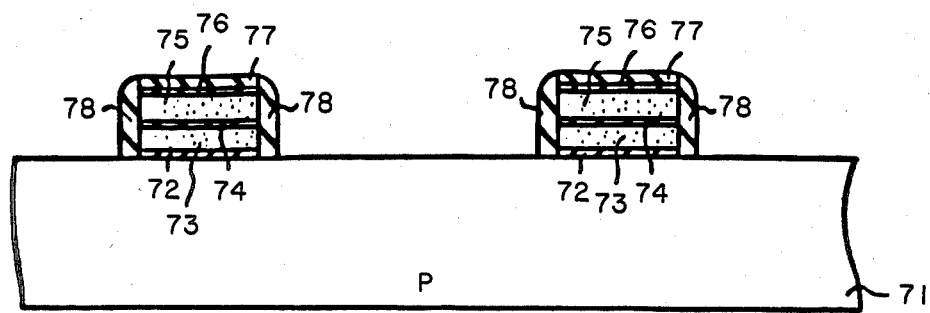
FIGS. 5A–5C are cross-sectional views showing the manufacturing steps used to produce a fourth embodiment of the CMOS semiconductor device, as used in an Erasable Programmable Read-Only Memory (EPROM) in accordance with the invention.
Figure 5B:
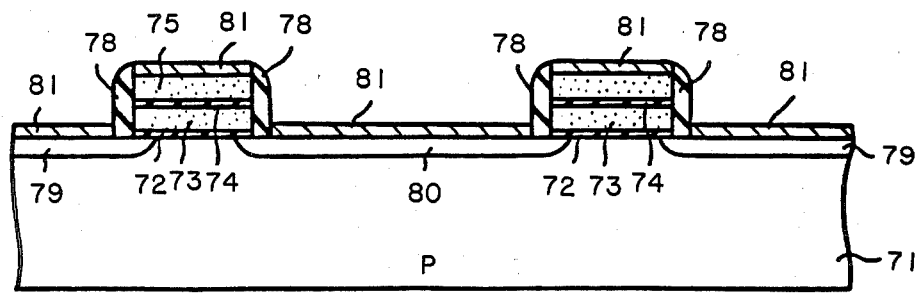
Figure 5C:
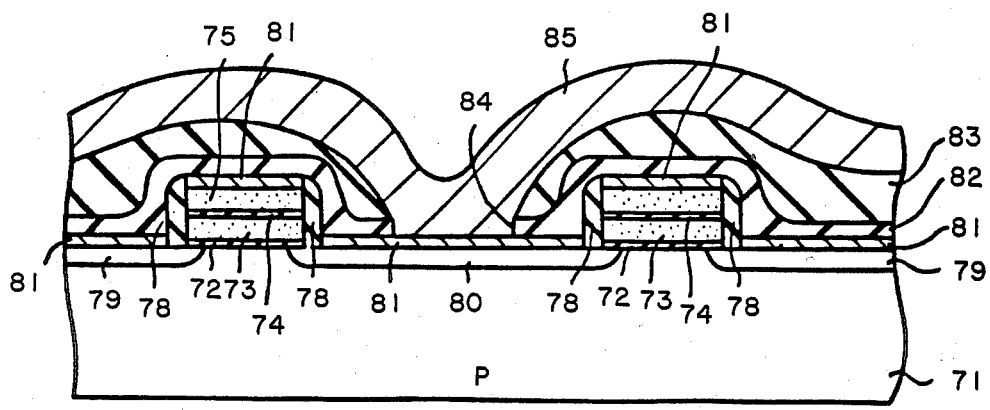

Next, the fourth embodiment shown in FIGS. 5A–5C will be explained. FIGS. 5A–5C are cross-sectional views showing the manufacturing steps to utilize the CMOS semiconductor device in an EPROM. Because the peripheral circuits are formed using the process of the third embodiment herein, a description of that manufacturing process is omitted. Only the fabrication of the memory cell will be explained.

First, a field insulation region (not shown) is formed in the surface of a p-type silicon substrate 71 having a well region for the peripheral circuits. After a first gate insulation layer 72 is formed on the whole surface of substrate 71, boron is ion-implanted into the substrate to control the channel threshold voltage (Vth) of the memory cell transistor. A first polysilicon layer 73 is formed on the device surface and is selectively removed to form the isolation region for the floating gate of the EPROM cells. The polysilicon layer in the peripheral circuit region is entirely removed. Gate insulation layers 72 around the cell region are removed, $SiO_2$ layers are formed on the substrate in the peripheral region and at the same time second gate oxide layers 74 are formed on polysilicon layers 72 of the cell portions by oxidizing the whole surface of the substrate. A second polysilicon layer 75 is formed on the whole surface of the substrate, and a $SiO_2$ layer 76 and a silicon nitride layer 77 are then formed thereon. A wiring layer for the gate electrode of the peripheral portion is formed, a low concentration diffused region is formed, and polysilicon layers 73 and 75 of the cell portion are patterned to the desired pattern. A $SiO_2$ layer 300Å thick is then formed on the surface of substrate 71 under the condition of 900° C. in $O_2$ atmoshpere. A $SiO_2$ layer 78 of 1500Å thickness is next formed by the CVD process and etched using an anisotropic etching technique so that only those parts of $SiO_2$ layer 78 along the side wall of polysilicon layers 73 and 75 remain, as shown in FIG. 5A.

Next, $N^+$-type source and drain regions 79 and 80 and $N^+$-type diffused regions (not shown) are simultaneously formed in the cell region and the peripheral region, respectively, by ion-implanting phosphorous. A $P^+$-type diffusion region is then formed in the peripheral region. Silicon nitride layers 77 and $SiO_2$ layers 76 in the cell and peripheral region are removed. A compound layer of 200Å–500Å thickness consisting of tungsten layer 81 and a tungsten silicide layer (not shown) is formed on the exposed source and drain regions 79 and 80 and second polysilicon layer 75 by the LPCVD process, as shown in FIG. 5B. A $SiO_2$ layer 82 of 3000Å thickness is formed on the device surface by the CVD process and PSG layer 83 of 3000Å thickness is then formed over $SiO_2$ layer 82. $SiO_2$ layer 82 and PSG layer 83 are selectively removed so as to open contact holes 84 above source region 79 and drain region 80. PSG layer 83 is melted by radiated light, as described earlier, to form a tapered portion in PSG layer 83 around contact hole 84. A halogen lamp can be used as the light source. A wiring layer 85 is formed on contact hole 84. Thus, the CMOS EPROM is fabricated as shown in FIG. 5C.

The fourth embodiment, described above, has the following advantages:

(1) Because of the double polysilicon structure, consisting of polysilicon layers 73 and 75 on the cell portion of the CMOS EPROM as shown in FIG. 5C, the angle of contact hole 84 is sharp and contact hole 84 is deep. Therefore formation of the wiring layer 85 is more difficult than formation of the other peripheral circuits and other semiconductor devices. However, according to this invention wiring layer 85 can be effectively formed.

(2) The stability of the memory cell when a high voltage (Vpp) is applied increases through use of the compound layer in the contact hole. When data is written into the EPROM cell, the word line has a voltage of 12.5 V applied and the bit line, including the selective bit, has a high voltage of about 8 V applied. A current of about 1 mA flows through the bit line and source line, in contrast to reading out the data from this memory through using a 5 V system. When the size of the contact hole is $1.2 \times 1.2$ ($\mu m^2$), a current concentration occurs partially between the wiring layer and the drain region at the bottom portion of the contact hole and the reliability of the wiring layer decreases. In particular, in prior art devices the thickness of the wiring layer is often about 1/10 the desired thickness because of the shadow effect of the vapor deposition at the bottom part of the contact hole in the wiring process. This thin wiring layer causes the wiring resistance to increase and the line becomes an open circuit. Therefore, this invention is particularly successful in forming the wiring layer of the CMOS EPROM device to increase its reliability.

In accordance with the above-described embodiment of the invention, it is stated that a compound consisting of the tungsten layer and the tungsten silicide layer is formed on the polysilicon layer, and the source and drain regions are then formed by the CVD process. The invention is not to be limited to the above disclosure. For example, after the polysilicon gate pattern and the source and drain regions of the transistor are formed, the titanium layer may be deposited by sputtering deposition. After the phosphorus and boron impurities are ion-implanted into the N-channel region and the P-channel region, respectively, the titanium silicide layer is selectively formed on the silicon by heating it at 600° C. in an atmosphere of $N_2$ gas. Only the titanium layer which does not react with the silicon is removed by the etching process. As a result, the self-aligned titanium silicide layers remain on the polysilicon gate pattern and the source and drain regions.

According to the invention described above in detail, the resistance of the contact hole is prevented from increasing. When the prior art wiring layer is formed on $1.0 \times 1.0$ ($\mu m^2$)-$1.2 \times 1.2$ ($\mu m^2$) contact holes, the characteristics of the contacts are non-ohmic at the p+ contact. However, in a device made according to this invention, the contact resistance is less than 50 in the same size contact.

Furthermore, the above-described invention prevents the mixing of the different impurities from one diffusion region to another, thus improving the reliability of the wiring layer and reducing the size of device.

Although this invention has been disclosed with reference to particular preferred embodiments, the principles involved are capable of other applications which will be apparent to those skilled in the art. The invention is therefore not to be limited to the above disclosure, but only as indicated by the scope of the claims to follow.

What is claimed is:

1. A method for manufacturing a complementary MOS semiconductor device on a semiconductor substrate having a well region formed in a portion of the surface of said substrate, the mthod comprising the sequential steps of:

forming a structure having a first conductive diffusion region containing a first conductive impurity in the surface of said semiconductor substrate, a second conductive duffusion region containing a second conductive impurity in said well region of said semiconductor substrate, and a gate electrode on each of said conductive diffusion regions;

forming a silicate glass insulation layer containing one of said first and second conductive impurities overlying said semiconductor substrate, said well region, said conductive diffusion regions, and said gate electrodes;

opening a contact hole by selectively removing a portion of said insulation layer overlying said first conductive diffusion region and a portion of said insulation layer overlying said second conductive diffusion region;

forming at least one metal layer on the surfaces of said first and second conductive duffusion region exposed by said contact holes, said metal being selected from the group consisting of metal and metal silicide;

heating said semiconductor substrate to melt at least part of said insulation layer and form a tapered portion thereof adjacent said contact hole; and forming a wiring layer on said metal layer in said contact hole.

2. The method according to claim 1, further including a step of ion-implanting a first conductive impurity into said first conductive diffusion region and a second conductive impurity into said second conductive diffusion region after said metal layer is formed.

3. A method according to claim 1, further including the step of ion-implanting silicon ions into said first conductive diffusion region and second conductive diffusion region after said metal layer is formed.

4. A method according to claim 1, wherein said metal layer consists of a tungsten silicide and tungsten.

5. A method according to claim 1, wherein said heating step is performed using light radiation.

6. A method according to claim 5, wherein said light radiation is performed by lamp annealing.

7. A method for manufacturing a complementary MOS semiconductor device, comprising the sequential steps of:

forming a structure having a first conductive diffusion region in a well region of a semiconductor substrate, a second conductive diffusion region in said semiconductor substrate and a gate electrode thereon;

forming at least one metal layer selected from a group consisting of metal and metal silicide on an exposed surface of said first conductive diffusion region and said second conductive diffusion region opening a contact hole by selectively removing that portion of said insulation layer corresponding to said first conductive diffusion region and said second conductive diffusion region;

heating said semiconductor substrate to melt at least part of said insulation layer and form a tapered portion thereof in the region of said contact hole; and forming a wiring layer on said contact hole.

8. A method according to claim 7, further including the step of ion-implanting a first conductive impurity into said first conductive diffusion region and a second conductive impurity into said second conductive diffusion region after said metal layer is formed.

9. A method according to claim 7, further including the step of ion-implanting silicon ions into said first conductive diffusion region and said second conductive diffusion region after said metal layer is formed.

10. A method according to claim 7, wherein said metal layer consists of a tungsten silicide and tungsten.

11. A method according to claim 7, wherein said heating step is performed using light radiation.

12. A method according to claim 11, wherein said light radiation method is performed by lamp annealing.

* * * * *